United States Patent [19]
Nishida et al.

[11] Patent Number: 5,221,872
[45] Date of Patent: Jun. 22, 1993

[54] PIEZOELECTRIC CERAMICS AND THEIR PRODUCTION METHODS

[75] Inventors: Masamitsu Nishida, Osaka; Hamae Ando, Neyagawa; Kouichi Kugimiya, Toyonaka, all of Japan

[73] Assignee: Matsushita Electronics Corporation, Ltd., Osaka, Japan

[21] Appl. No.: 889,064

[22] Filed: May 26, 1992

[30] Foreign Application Priority Data

May 23, 1991 [JP] Japan .................. 3-118577

[51] Int. Cl.⁵ .................. H01L 41/10; C04B 35/49
[52] U.S. Cl. .................. 310/358; 252/62.9
[58] Field of Search .......... 310/311, 358, 359, 346; 252/62.9

[56] References Cited

U.S. PATENT DOCUMENTS

| | | | |
|---|---|---|---|
| 4,019,915 | 4/1977 | Miyauchi et al. | 106/73.31 |
| 4,675,123 | 6/1987 | Tsunooka et al. | 252/62.9 |
| 4,917,810 | 4/1990 | Tsunooka et al. | 252/62.9 |
| 4,977,547 | 12/1990 | Giniewicz et al. | 367/157 |
| 5,169,551 | 12/1992 | Tsunooka et al. | 252/62.9 |

Primary Examiner—Mark O. Budd
Attorney, Agent, or Firm—Ratner & Prestia

[57] ABSTRACT

A piezoelectric ceramic comprising at least two kinds of ceramic domains that are different from each other either in composition or in piezoelectric characteristics. It is made possible to produce a piezoelectric ceramic with better piezoelectric characteristics than that composed of a single kind of ceramic domain by having the compositions or the piezoelectric characteristics of each ceramic domain properly selected. For example, it is possible to obtain a piezoelectric ceramic of an extremely small rate of change in resonance frequency in response to a change in temperature by having a ceramic domain with a positive rate of change in resonance frequency in response to a change in temperature and the one with a negative rate of change in resonance frequency in response to a change in temperature combined.

9 Claims, 1 Drawing Sheet

5,221,872

PIEZOELECTRIC CERAMICS AND THEIR PRODUCTION METHODS

BACKGROUND OF THE INVENTION

1. Field of the Invention

This invention relates to a piezoelectric ceramic that has various applications such as ceramic filter, piezoelectric buzzer, piezoelectric ignition, ultrasonic vibrator, etc. and its production method.

2. Description of the Prior Art

Such piezoelectric ceramics as two-component system of $Pb(Ti, Zr)O_3$, three component system of $Pb(Mg_{1/3} Nb_{\frac{2}{3}})_xTi_yZr_zO_3$, four-component system of $Pb(Zn_{1/3} Nb_{\frac{2}{3}})_w(Sn_{1/3} Nb_{\frac{2}{3}})_xTi_yZr_zO_3$ and the like have been so far known. The structure of these conventional piezoelectric ceramics shows a uniform single composition throughout its entirety and any part of the ceramics shows the identical composition within certain tolerance and also has the identical piezoelectric characteristics. Therefore, when a piezoelectric ceramic for a certain specific application is to be selected the one with a composition that shows piezoelectric characteristics closest to requirements is selected or some improvements are applied to the composition to satisfy the requirements in piezoelectric characteristics.

However, there is a limit to satisfying the required piezoelectric characteristics by resorting only to selection from the compositions available as in the foregoing or improvement of such existing compositions. Especially, it is difficult to obtain a piezoelectric ceramic that shows small changes in piezoelectric characteristics like resonant frequency, etc. by temperature and time.

SUMMARY OF THE INVENTION

An object of this invention is to provide a piezoelectric ceramic having a structure whereby its piezoelectric characteristics are controlled as desired.

Also, this invention aims at producing a piezoelectric ceramic of small changes in piezoelectric characteristics by temperature.

In addition, an object of this invention is to realize a piezoelectric ceramic that shows small changes in piezoelectric characteristics with lapse of time.

Furthermore, an object of this invention is to disclose a production method for the foregoing piezoelectric ceramics.

In order to accomplish these objects the piezoelectric ceramics of this invention have a structure composed of either (1) at least two kinds, or types of ceramic domain that are different from each other in composition and wherein at least one domain has piezoelectricity or (2) at least two kinds, or types of ceramic domain that are different from each other in piezoelectric characteristics.

The piezoelectric ceramics of this structure possessing a multiple number of ceramic domains that are different from one another either in composition or in piezoelectric characteristics have more freedom in selecting compositions or piezoelectric characteristics compared with the conventional piezoelectric ceramics consisting of the domains of a single composition or the same piezoelectric characteristics. Therefore, by selecting the composition or the piezoelectric characteristics of the respective domains in a suitable manner, a piezoelectric ceramic to meet with the required piezoelectric characteristics better than the conventional one can be obtained.

For example, it is difficult to get a piezoelectric ceramic of a small rate of resonant frequency in response to a change in temperature by using the conventional piezoelectric ceramics that consist of one domain of a single composition. On the other hand, it is made possible by this invention to produce a piezoelectric ceramic with a rate of resonant frequency in response to a change in temperature that is smaller by about one digit, or order of magnitude, compared with that of the conventional piezoelectric ceramics due to the use of a piezoelectric ceramic composed of two kinds of domain, one with a positive rate of change by resonant frequency in response to a change in temperature and the other with a negative one. Also, it is possible to obtain a piezoelectric ceramic of a smaller rate of change in resonant frequency change in response to a time lapse compared with that of the conventional piezoelectric ceramics by using a ceramic composition of more than two proper domains that are different from one another in composition or in piezoelectric characteristics.

A production method for the foregoing piezoelectric ceramics consisting of more than one domain that are different from one another in composition and in piezoelectric characteristics is described in the following:

First, ceramic powders of more than one kind that have an average particle size of less than 0.6 μm inclusive and differ from one another in composition or in piezoelectric characteristics are prepared through the processes of raw material mixing, calcining and grinding. Then, the respective ceramic powders are applied with a binder and granulated. These granulated powders are mixed and molded into a shape. The molded bodies are then sintered to complete a piezoelectric ceramic.

According to the production method of this invention, sintering at a lower temperature is made possible since fine powders of less than 0.6 μm inclusive in the average particle diameter are employed. Therefore, transformation of domains that are different from one another in composition or in piezoelectric characteristics into a single uniform domain by a reaction taking place between domains at the time of sintering is prevented from happening. Also, forming of reactive layers at the boundary of domains is suppressed. Even after sintering, at least two kinds of domain that are different from one another in composition or in piezoelectric characteristics are kept in place.

DETAILED DESCRIPTION OF THIS INVENTION

As a typical example of the piezoelectric ceramics of this invention, the one consisting of two domains that are different from each other in piezoelectric characteristics is explained below with the help of drawings.

Figure 1:
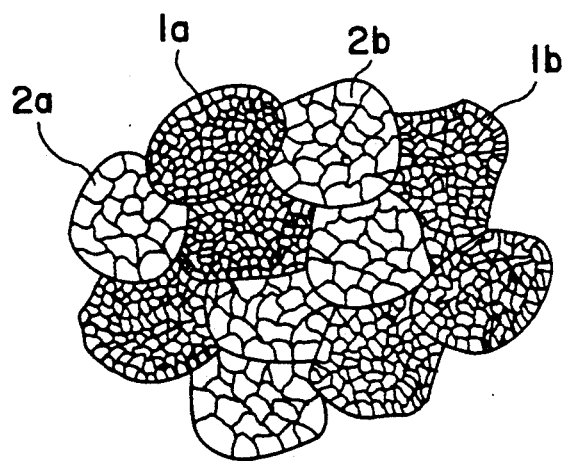
FIG. 1 shows a pictorial model view of the inside structure for a typical piezoelectric ceramic of this invention.

FIG. 1 is a pictorial model view of the internal structure of the above piezoelectric ceramic based on a microscopic observation. In FIG. 1, 1a and 1b show the first ceramic domain that consists of a 3-component system of $Pb(Mg_{1/3}Nb_{2/3})_xTi_yZr_zO_3$. The areas 2a and 2b are the second ceramic domain that consists of a 3-component system like the first ceramic domain but differs in composition ratios and piezoelectric characteristics from the first ceramic domain. These ceramic domains consist of many collective bodies, each having an average size of approximately 100 μm in diameter and comprising many crystalline grains of an identical composition with an average grain size of around 3 μm in diameter. According to FIG. 1, the first ceramic domains 1a and 1b do not appear combined together with each other but actually they are combined in the back side of the second ceramic domain 2b. This is observed when the whole structure is looked at three-dimensionally. Likewise, the second ceramic domains 2a and 2b are combined in the back side of the first ceramic domain of 1a.

Figure 2:
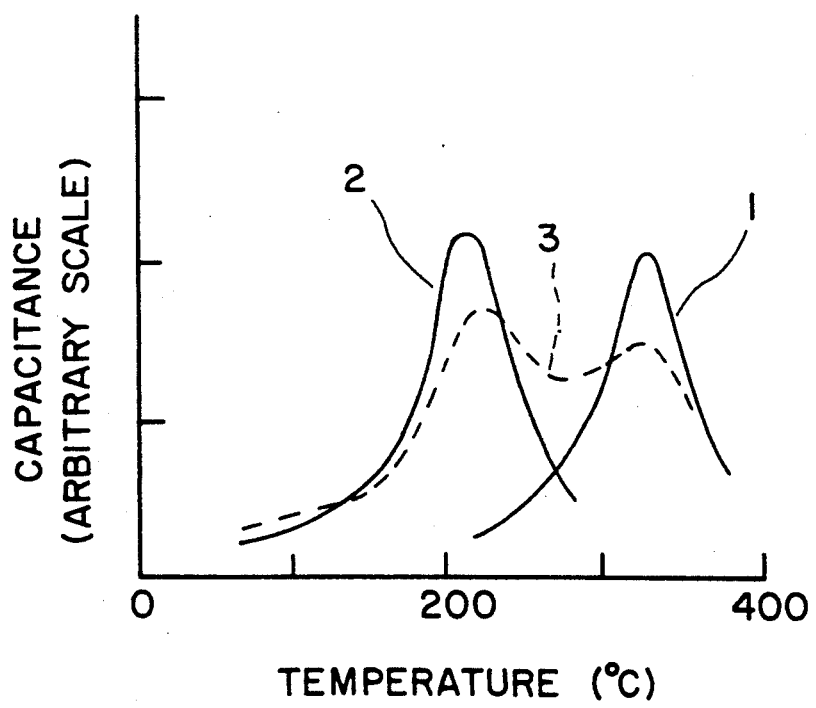
FIG. 2 is a graph to show the relationship between capacitance and temperature explaining the internal structure of a typical piezoelectric ceramic of this invention.

The capacitance vs. temperature curves of FIG. 2 constitute a central feature of the foregoing piezoelectric ceramic. The curve (1) of FIG. 2 shows a characteristic curve of a piezoelectric ceramic wherein the composition is uniform and the same as that of the first ceramic domain, the curve (2) shows a characteristic curve of a piezoelectric ceramic with the same composition as that of the second ceramic domain and the curve (3) shows a characteristic curve of a piezoelectric ceramic composed of the almost equal portion of the first ceramic domain and the second ceramic domain. The two peak temperature values of the curve (3) agree approximately with the peak temperature values of the curves (1) and (2) respectively. Therefore, it is clarified from FIG. 2 that the piezoelectric ceramics of this invention have the characteristics of the two ceramic domains having different piezoelectric characteristics.

Thus, the piezoelectric ceramics composed of two ceramic domains can be made to have the required piezoelectric characteristics by choosing properly composition or piezoelectric characteristics for both the first ceramic domain and the second ceramic domain.

For example, as shown later in Example 1, when the rate of change in resonant frequency in response to a change in temperature for the piezoelectric characteristics of the first ceramic domain is set forth as minus 0.98%/° C. and the one for the second ceramic domain is as 1.23%/° C. and the almost equal portions of the respective ceramic domains are combined to make a piezoelectric ceramics, the rate of the change in resonant frequency in response to a change in temperature for the piezoelectric ceramics can be made as extremely small as 0.31%/° C.

In the foregoing, typical embodiments of this invention for piezoelectric ceramics have been explained by examples where two kinds, or types of ceramic domain having different composition ratios and rates of change in resonant frequency in response to a change in temperature are involved. However, the piezoelectric ceramics of this invention are not limited to the ones explained in these examples. According to this invention, three or more kinds of ceramic domain that are different from one another in composition ratios or in piezoelectric characteristics can be used and employment of more kinds of ceramic domain makes it possible to control more finely piezoelectric characteristics, consequently meeting closely with the requirements for the piezoelectric characteristics. In addition, the composition is not limited only to the one of the same component system with varying composition ratios and it can be a combination of the compositions of various component systems. For instance, as explained later in Example 2, a piezoelectric ceramic of an extremely small rate of change in resonant frequency in response to a time lapse is obtained by combining 3-component system and 4-component system piezoelectric ceramics. Besides, inclusion of additives other than the main ingredients to improve various properties and also unwanted inclusion of impurities not avoidable in the production processes into the ceramic composition do not cause any problems.

Furthermore, all of the ceramic domains of more than one kind to compose the piezoelectric ceramics are not necessarily required to be piezoelectric. For example, as in Example 3, a combination of a piezoelectric ceramic and a dielectric ceramic without any piezoelectricity is accepted with a resultant piezoelectric ceramic of an extremely small rate of capacitance change by temperature.

As stated in the foregoing, the ceramic domains of the piezoelectric ceramics as disclosed by this invention consist of many collective bodies, each of which comprises crystalline grains composed of the same composition. The average crystalline grain size of the foregoing example is about 3 μm in diameter but when the volume of the piezoelectric ceramics is large enough a piezoelectric ceramic of a uniform composition is obtained even with larger average grain sizes. Therefore, no limitation is imposed onto the average crystalline grain sizes in this invention. However, when a piezoelectric ceramic of this invention is used in a high frequency range and its average crystalline grain sizes are large, the mechanical Q factor is reduced. So, it is desirable not to make the average crystalline grain sizes exceed 5 μm. Additionally, the lower limit of the average crystalline grain size should only be in excess of the grain size whereby piezoelectricity is not lost. In the foregoing 3-component system piezoelectric ceramics of $Pb(Mg_{1/3}Nb_{2/3})_xTi_yZr_zO_3$, for example, the average grain size should only be 0.1 μm or more.

The average diameter of the collective body of the crystalline grains as described in the foregoing typical embodiment is about 100 μm and its desirable ranges are from 5 to 300 μm. When the average diameter exceeds 300 μm, the composition and the piezoelectric characteristics start to lose uniformity and when the average sizes do not reach 5 μm, it becomes difficult to obtain the required piezoelectric characteristics. The reason is that the proportion of the active layers formed in the boundary areas existent between ceramic domains with composition being different from one another becomes too large. It is desirable to make the volume of the active layers as small as possible for achieving the required piezoelectric characteristics but a certain volume of the active layers is tolerated as long as it does not reach the level of deteriorating the piezoelectric characteristics greatly. Further, it is naturally desirable to have the collective bodies of the crystalline grains with the same composition combined to form uniform ceramic domains of larger sizes but existence of an independent single collective body or a small number of collective bodies combined to form a partially existent ceramic domain does not impair the effectiveness of this invention.

Now, as a typical example of production method for piezoelectric ceramics of this invention, a production method for a piezoelectric ceramic composed of two kinds of ceramic domains that comprise different component systems is taken up and explained in the following:

First, oxides such as $Pb_3O_4$, $TiO_2$, etc. are used as the raw materials and mixed. Then, the mixture is calcined at the temperature of 800° to 1200° C. and ground to get a calcined powder of 3-component system, $Pb(Zn_{1/3}Nb_{\frac{2}{3}})_xTi_yZr_zO_3$, with an average particle size of 0.6 μm in diameter. By the method similar to above a calcined powder of 4-element system, $Pb(Zn_{1/3}Nb_{\frac{2}{3}})_w(Sn_{1/3}Nb_{\frac{2}{3}})_xTi_yZr_zO_3$, is prepared. Each of these calcined powders is added with an organic binder and granulated and then sifted through screens to get granulated powders of 3-element system and 4-element system both having an average particle size not exceeding 500 μm in diameter.

Next, these two kinds of granulated powders are mixed, formed by press molding and then the molded shapes are sintered at a relatively low temperature of 900° to 1250° C. Thus, a piezoelectric ceramic consisting of two different element systems is produced.

In connection with the production method for piezoelectric ceramics of this invention, calcined powders prepared by calcination of the raw materials of oxides are usually used as the ceramic powders for granulation as described in the foregoing typical example. However, as long as the specified ceramic powders are obtained, ceramic powders prepared by other methods like the one utilizing chemical reactions can also be used. Also, granulation can be performed after calcined powders of different kinds are mixed together. However, this granulation method tends to form active layers at the time of sintering. So, it is desirable to granulate each calcined powder separately as in the above typical example.

The average particle size of the granulated powders can exceed 500 μm in diameter but this average particle size is in correlation with the average diametrical dimension of the piezoelectric ceramic collective bodies after sintering. So, the finer the granulated powders are, the more uniform composition is formed for the piezoelectric ceramics. However, the granulated powders of too small particles tend to form active layers at the time of sintering and an average particle size ranging from 50 to 500 μm is desirable.

Moreover, as described in the foregoing typical example of this invention, the calcining and sintering temperatures as employed in the production method of this invention are 800° to 1200° C. and 900° to 1250° C. for the calcining process and the sintering process respectively. When the sintering temperature is high, more active layers are formed and it becomes difficult to obtain the required piezoelectric characteristics. Therefore, in order to decrease active layer forming, calcined powders of a uniform composition are made by employing a higher calcining temperature and then the sintering is successfully performed at a sintering temperature that is lower than the calcining temperature.

By the help of embodiment examples, the details of this invention is explained in the following:

EXAMPLE 1

First, the raw materials of PbO, MgO, $Nb_2O_5$, $TiO_2$ and $ZrO_2$ are weighed so that the composition after calcining the mixture of these raw materials shows Composition A of $Pb(Mg_{1/3}Nb_{\frac{2}{3}})_{0.125}Ti_{0.435}Zr_{0.440}O_3$ and mixed in a ball mill and then ground to fine powders in a media agitating mill after calcining at 850° C. for 2 hours. Thus, the calcined powders of Composition A with an average particle size of 0.58 μm are prepared. By a similar method, calcined powders having an average particle size similar to above and consisting of Composition B, $Pb(Mg_{1/3}Nb_{\frac{2}{3}})_{0.375}Ti_{0.375}Zr_{0.250}O_3$, are prepared. These two kinds of calcined powders are separately added with an organic binder and granulated and then put through filtering meshes with a resultant yield of two kinds of granulated powders having an average particle size of 500 μm max. in diameter and compositions different from each other.

Then, these two kinds of granulated powders are mixed in a varying ratio with a caution exercised not to destroy the particles and the mixture is press molded with a molding die into a disc shape of 13 mm in diameter and about 1 mm in thickness. These molded bodies are then sintering at 1150° C. for 2 hours to obtain the piezoelectric ceramics of Sample Nos. 1 through 9.

In the next step, these samples are polished on the surface to the thickness of about 0.3 mm and then electrodes composed of a Cr-Au alloy are formed on both sides of the sample discs by a vacuum evaporation method. Further, the samples are put through a poling treatment whereby a DC electric field of 3 kV/mm is applied across both electrodes for 30 minutes with the whole samples immersed in silicone oil of 160° C. Then, such characteristics as dielectric constant, coupling coefficient, rate of change in resonant frequency over the temperature range of 20° to 80° C., etc. are measured with these samples by means of a capacitance bridge, a network analyzer, etc. Also, the internal structure of the samples is observed with the help of a scanning electron microscope (SEM) and an electron probe microanalyzer (EPMA) and the average diameter of the crystalline grains are calculated by an intercept method. Table 1 shows the measurement results.

The samples numbered 1 and 9 are with a single uniform composition for the purpose of comparison with the ones of this invention.

TABLE 1

| Sample Number | Mixing Ratio of Compositions A and B (wt. %) | | Dielectric Constant | Coupling Coefficient | Rate of Change in Resonant Frequency by Temperature (%/°C.) | Average Grain Size (μm) | Average Collective Body Size (μm) |
| --- | --- | --- | --- | --- | --- | --- | --- |
| | A | B | | | | | |
| *1 | 100 | 0 | 1650 | 0.65 | −0.98 | 2.8 | — |
| 2 | 90 | 10 | 1660 | 0.65 | −0.76 | 2.7 | 134 |
| 3 | 80 | 20 | 1660 | 0.66 | −0.46 | 3.2 | 123 |
| 4 | 60 | 40 | 1670 | 0.67 | −0.12 | 3.3 | 150 |
| 5 | 50 | 50 | 1660 | 0.67 | 0.31 | 3.5 | 154 |
| 6 | 40 | 60 | 1670 | 0.68 | 0.64 | 3.4 | 144 |
| 7 | 20 | 80 | 1690 | 0.66 | 0.88 | 3.4 | 129 |
| 8 | 10 | 90 | 1700 | 0.66 | 0.92 | 3.5 | 106 |

TABLE 1-continued

| Sample Number | Mixing Ratio of Compositions A and B (wt. %) | | Dielectric Constant | Coupling Coefficient | Rate of Change in Resonant Frequency by Temperature (%/°C.) | Average Grain Size (μm) | Average Collective Body Size (μm) |
| --- | --- | --- | --- | --- | --- | --- | --- |
| | A | B | | | | | |
| *9 | 0 | 100 | 1710 | 0.67 | 1.23 | 3.6 | — |

Note: The sample numbers with * show that the samples are for a comparison purpose.

As clearly seen from Table 1, various piezoelectric characteristics that are different from those of a single uniform composition are obtained by changing the mixing ratio of Composition A and Composition B. Especially, the number 4 sample, a mixture of 60 wt. % of Composition A that has a negative rate of change in resonant frequency in response to a change in temperature and 40 wt. % of Composition B that has a positive rate of change in resonant frequency in response to a change in temperature, shows a rate of change in resonant frequency in response to a change in temperature that is almost 1/10 of that of the number 1 sample or the number 9 sample, both consisting of a single uniform composition.

Thus, it is made possible to produce a piezoelectric ceramic with two different ceramic domains and excellent piezoelectric characteristics by using two kinds of calcined powders that are different in composition from each other.

EXAMPLE 2

First, the raw materials of $Pb_3O_4$, ZnO, $Nb_2O_5$, $TiO_2$, $ZrO_2$ and $MnO_2$ are weighed so that the composition after calcining the mixture of these raw materials shows Composition C of $Pb(Zn_{1/3}Nb_{2/3})_{0.125}Ti_{0.490}Zr_{0.385}O_3$ + 1 wt. % $MnO_2$ and mixed in a ball mill and then ground to fine powders in a media agitation mill after calcining at 1150° C. for 2 hours. Thus, the calcined powders of Composition C with an average particle size of 0.19 μm in diameter are prepared. By a similar method except for using an additional raw material of $SnO_2$, calcined powders having an average particle size similar to above and consisting of Composition D, $Pb(Zn_{1/3}Nb_{2/3})_{0.06}(Sn_{1/3}Nb_{2/3})_{0.06}Ti_{0.51}Zr_{0.37}O_3$ + 1 wt. % $MnO_2$, are prepared. These two kinds of calcined powders are separately added with an organic binder and granulated and then put through filtering meshes with a resultant yield of two kinds of granulated powders having an average particle size of 106 μm max. in diameter and component system different from each other.

Then, these two kinds of granulated powders are mixed in a varying ratio with a caution exercised not to destroy the particles and the mixture is press molded with a molding die into a disc shape of 13 mm in diameter and about 1 mm in thickness. These molded bodies are then sintered at 1100° C. for 2 hours to obtain the piezoelectric ceramics of Sample Nos. 10 through 18.

In the next step, these samples are polished on the surfaces to the thickness of about 0.3 mm and then electrodes composed of a Cr-Au alloy are formed on both sides of the sample discs by a vacuum evaporation method. Further, the samples are put through a poling treatment whereby a DC electric field of 3 kV/mm is applied across the both electrodes for 30 minutes with whole samples immersed in silicone oil of 160° C. Then, such characteristics as dielectric constant, coupling coefficient, resonant frequency over the temperature range of 20° to 80° C., etc. are measured with these samples by means of a capacitance bridge, a network analyzer, etc. Also, the internal structure of the samples is observed with the help of a scanning electron microscope(SEM) and an electron probe microanalyzer-(EPMA) and the average diameter of the crystalline grains and that of the collective bodies of the crystalline grains are calculated by an intercept method.

Table 2 shows the measurement results.

The samples numbered 10 and 18 are with a single uniform composition for the purpose of comparison with the ones of this invention.

TABLE 2

| Sample Number | Mixing Ratio of Compositions C and D (wt. %) | | Dielectric Constant | Coupling Coefficient | Rate of Change in Resonant Frequency by Temperature (%/°C.) | Rate of Change in Resonant Frequency by Time (ppm/td) | Average Grain Size (μm) | Average Collective Body Size (μm) |
| --- | --- | --- | --- | --- | --- | --- | --- | --- |
| | C | D | | | | | | |
| *10 | 100 | 0 | 605 | 0.33 | 0.214 | 246 | 1.9 | — |
| 11 | 90 | 10 | 612 | 0.33 | 0.131 | 198 | 1.8 | 33 |
| 12 | 70 | 30 | 627 | 0.34 | 0.089 | 94 | 1.9 | 36 |
| 13 | 60 | 40 | 625 | 0.35 | 0.038 | 72 | 1.9 | 40 |
| 14 | 50 | 50 | 631 | 0.35 | 0.010 | 31 | 1.8 | 31 |
| 15 | 40 | 60 | 603 | 0.34 | −0.031 | −13 | 1.8 | 29 |
| 16 | 30 | 70 | 610 | 0.33 | −0.065 | −79 | 2.0 | 32 |
| 17 | 10 | 90 | 599 | 0.33 | −0.120 | −114 | 2.0 | 36 |
| *18 | 0 | 100 | 584 | 0.32 | −0.165 | −152 | 2.1 | — |

Note: The sample numbers with * show that the samples are for a reference.

As clearly seen from Table 2, various piezoelectric characteristics that are different from those of a single uniform composition are obtained by changing the mixing ratio of Composition C and Composition D. Especially, the number 14 piezoelectric ceramic sample made by a mixture of equal volumes of Composition C and Composition D has extremely small values both in the rate of change in resonant frequency by temperature and in the rate of change in resonant frequency by time.

Thus, it is made possible to produce a piezoelectric ceramic of excellent piezoelectric characteristics by using two kinds of calcined powders that are different in component system from each other.

EXAMPLE 3

First, the raw materials of $Pb_3O_4$, $MgO$, $Nb_2O_5$, $TiO_2$ and $ZrO_2$ are weighed so that the composition after calcining the mixture of these raw materials shows Composition E of $Pb(Mg_{1/3}Nb_{2/3})_{0.25}Ti_{0.40}Zr_{0.35}O_3$ and mixed in a ball mill and then ground to fine powders in a media agitating mill after calcining at 1150° C. for 2 hours. Thus, the calcined powders of Composition E with an average particle size of 0.20 μm in diameter are prepared. By a similar method using raw materials of $Pb_3O_4$, $NiO$, $Nb_2O_5$ and $TiO_2$, calcined powders of non-piezoelectricity having an average particle size similar to above and consisting of Composition F, $Pb(Ni_{1/3}Nb_{2/3})_{0.9}Ti_{0.1}O_3$, are prepared.

These two kinds of calcined powders are separately added with an organic binder and granulated and then put through filtering meshes with a resultant yield of two kinds of granulated powders, one with piezoelectricity and the other without piezoelectricity, both having an average particle size of 212 μm max. in diameter.

Then, these two kinds of granulated powders are mixed in a varying ratio with a caution exercised not to destroy the particles and the mixture is press molded with a molding die into a disc shape of 13 mm in diameter and about 1 mm in thickness. These molded bodies are then sintered at 1050° C. for 2 hours to obtain the piezoelectric ceramics of Sample Nos. 19 through 23.

In the next step, these samples are polished on the surface to the thickness of about 0.3 mm and then electrodes composed of a Cr-Au alloy are formed on the both sides of the sample discs by a vacuum evaporation method. Further, the samples are put through a poling treatment whereby a DC electric field of 3 kV/mm is applied across both electrodes for 30 minutes with the whole samples immersed in silicone oil of 160° C. Then, such characteristics as dielectric constant, coupling coefficient, rate of change in capacitance over the temperature range of 20° to 80° C., etc. are measured with these samples by means of a capacitance bridge, a network analyzer, etc. Also, the internal structure of the samples is observed with the help of a scanning electron microscope(SEM) and an electron probe microanalyzer(EMPA) and the average diameter of the crystalline grains and that of the collective bodies of the crystalline grains are calculated by an intercept method.

Table 3 shows the measurement results.

The samples numbered 19 and 23 are with a single uniform composition for the purpose of comparison with the ones of this invention.

As clearly seen from Table 3, piezoelectric characteristics that are different from those of a single uniform composition are obtained by combining Composition E having piezoelectricity and Composition F having no piezoelectricity. Especially, the piezoelectric ceramic of sample number 21 consisting of 95 wt. % of Composition E and 5 wt. % of Composition F shows an extremely small rate of capacitance change by temperature when compared with that of a single uniform composition like the sample number 19 or 23.

Thus, it is possible to produce a piezoelectric ceramic of excellent piezoelectric characteristics by using calcined powders of piezoelectric ceramics and the ones of dielectric ceramics having no piezoelectricity.

What is claimed is:

1. A piezoelectric ceramic comprising at least two types of ceramic domains having different compositions from each other, wherein at least one of the ceramic domains is piezoelectric.

2. A piezoelectric ceramic according to claim 1, wherein the ceramic domains comprise collective bodies of crystalline grain, each of the collective bodies having an average diameter which ranges from 5 μm min. to 300 μm max.

3. A piezoelectric ceramic according to claim 1, wherein the ceramic domains comprise crystalline grains each having a maximum diameter of 5 μm.

4. A piezoelectric ceramic according to claim 1, wherein at least one type of the ceramic domains is dielectric.

5. A piezoelectric ceramic comprising at least two types of ceramic domains that are different from each other in piezoelectric characteristics.

6. A piezoelectric ceramic according to claim 5, wherein the two or more types of ceramic domains have different rates of change in resonance frequency in response to a change in temperature.

7. A piezoelectric ceramic according to claim 5, wherein the two or more types of ceramic domains have different rates of change in resonance frequency in response to a lapse of time.

8. A piezoelectric ceramic according to claim 5, wherein the ceramic domains comprise collective bodies of crystalline grain, each of the collective bodies having an average diameter which ranges from 5 μm min. to 300 μm max.

9. A piezoelectric ceramic according to claim 5, wherein the ceramic domains comprise crystalline grains each having a maximum diameter of 5 μm.

* * * * *

TABLE 3

| Sample Number | Mixing Ratio of Compositions E and F (wt. %) | | Dielectric Constant | Coupling Coefficient | Rate of Change in Capacitance by Temperature (ppm/°C.) | Average Grain Size (μm) |
| --- | --- | --- | --- | --- | --- | --- |
| | E | F | | | | |
| *19 | 100 | 0 | 343 | 0.36 | 3500 | 3.4 |
| 20 | 98 | 2 | 339 | 0.37 | 560 | 3.4 |
| 21 | 95 | 5 | 359 | 0.36 | 350 | 3.2 |
| 22 | 93 | 7 | 437 | 0.33 | −680 | 3.8 |
| *23 | 0 | 100 | 5426 | 0.00 | −15000 | 4.2 |

Note: The sample numbers with * show that the samples are for a reference.

UNITED STATES PATENT AND TRADEMARK OFFICE
CERTIFICATE OF CORRECTION

PATENT NO.   : 5,221,872
DATED        : June 22, 1993
INVENTOR(S)  : Nishida et al.

It is certified that error appears in the above-identified patent and that said Letters Patent is hereby corrected as shown below:

Column 2, line 4, before "resonant" the words "change in" should be inserted;

Column 2, line 9, before "resonant" the words "change in" should be inserted; and Column 2, line 14, delete "change by" and insert therefor "change in".

Signed and Sealed this

First Day of November, 1994

Attest:

BRUCE LEHMAN

Attesting Officer

Commissioner of Patents and Trademarks